US007238051B2

(12) United States Patent
Miyawaki et al.

(10) Patent No.: US 7,238,051 B2
(45) Date of Patent: Jul. 3, 2007

(54) PC CARD

(75) Inventors: Chikanori Miyawaki, Neyagawa (JP); Mikiya Ueda, Kobe (JP); Yoshiaki Akutagawa, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 11 days.

(21) Appl. No.: 10/552,469

(22) PCT Filed: Jul. 5, 2004

(86) PCT No.: PCT/JP2004/009884

§ 371 (c)(1),
(2), (4) Date: Oct. 7, 2005

(87) PCT Pub. No.: WO2005/004043

PCT Pub. Date: Jan. 13, 2005

(65) Prior Publication Data

US 2006/0232950 A1    Oct. 19, 2006

(30) Foreign Application Priority Data

Jul. 7, 2003    (JP) .............................. 2003-192647

(51) Int. Cl.
*H01R 24/00*    (2006.01)

(52) U.S. Cl. ...................................... 439/630; 235/441
(58) Field of Classification Search ................ 439/260, 439/630–633; 235/441
See application file for complete search history.

(56) References Cited

U.S. PATENT DOCUMENTS 6,241,545 B1 * 6/2001 Bricaud et al. ............. 439/326
6,808,424 B2 * 10/2004 Kaneshiro et al. .......... 439/638

FOREIGN PATENT DOCUMENTS

| JP | 09102019 A | 4/1997 |
| JP | 2001175428 A | 6/2001 |
| JP | 2001188883 A | 7/2001 |
| WO | WO 03/073246 A1 | 9/2003 |

* cited by examiner

*Primary Examiner*—Truc Nguyen
(74) *Attorney, Agent, or Firm*—Steptoe & Johnson LLP

(57) ABSTRACT

An object of the present invention is to provide a PC card having four SD memory cards therein, which maintains the positional accuracy of the SD memory cards and connectors, and has high contact stability. The PC card includes in its case a printed circuit board (3), connectors (4) secured to the printed circuit board (3), and pressing members (6) secured to the printed circuit board (3). The pressing members (6) hold two SD memory cards respectively, while pressing them to the printed circuit board (3) and the connector (4).

14 Claims, 15 Drawing Sheets

F I G. 6
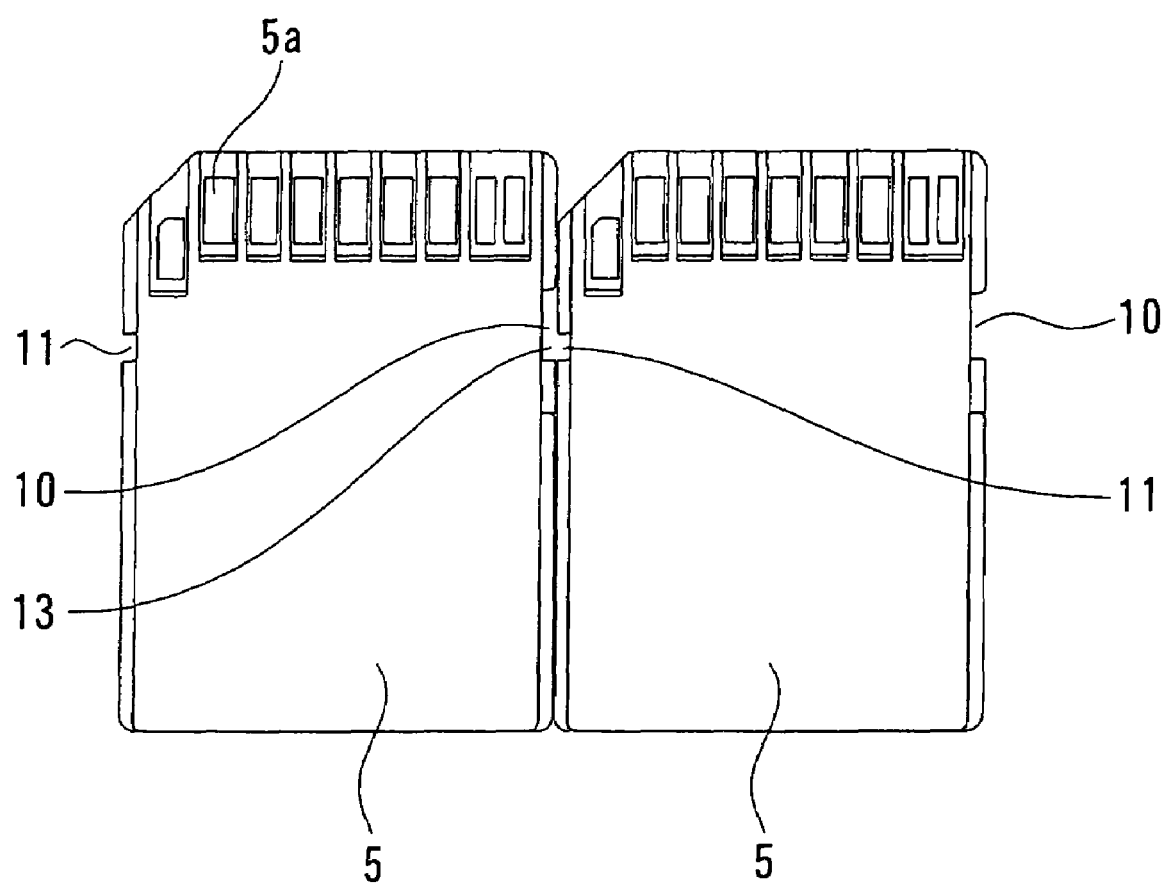

F I G. 10
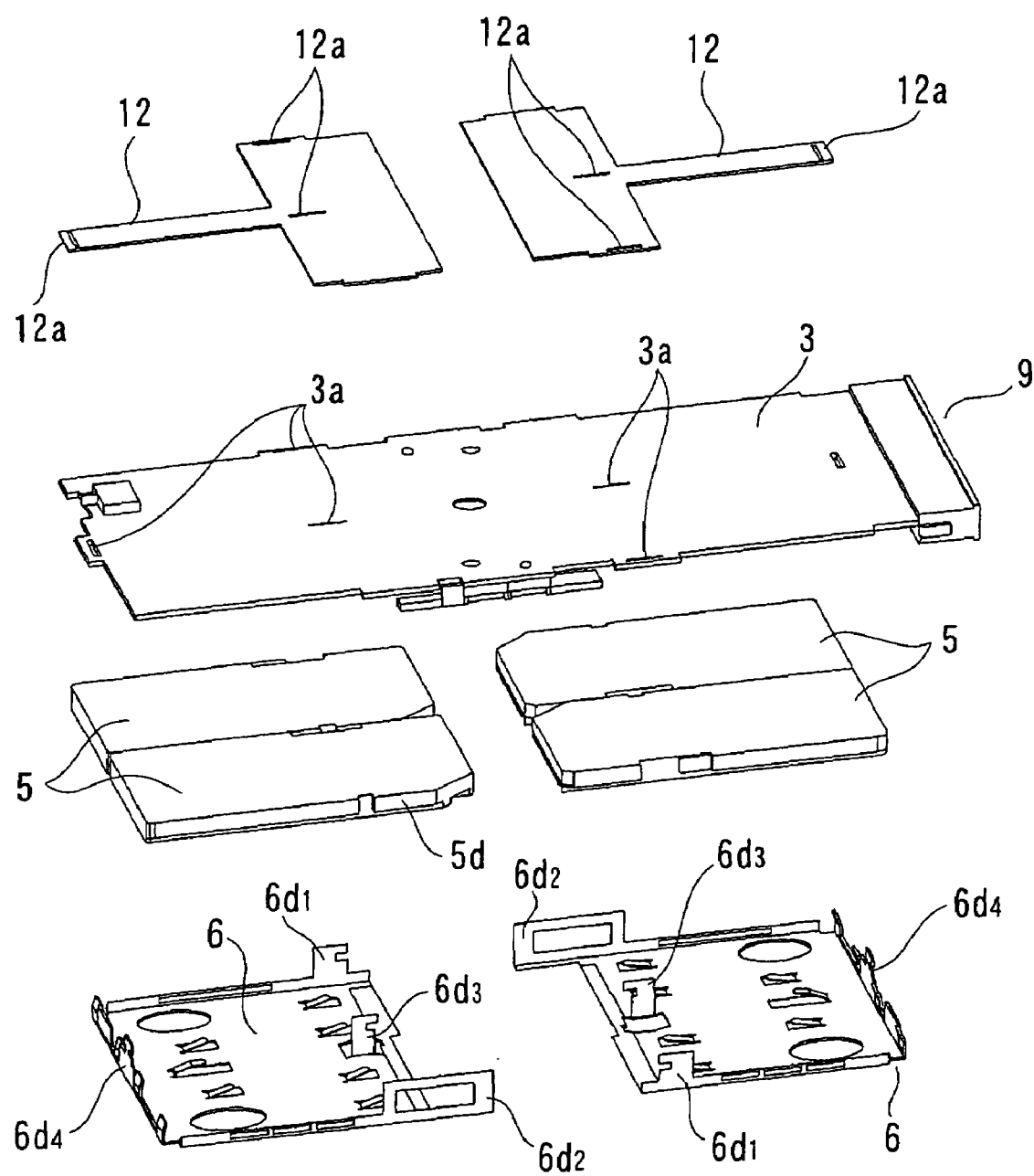

F I G. 14
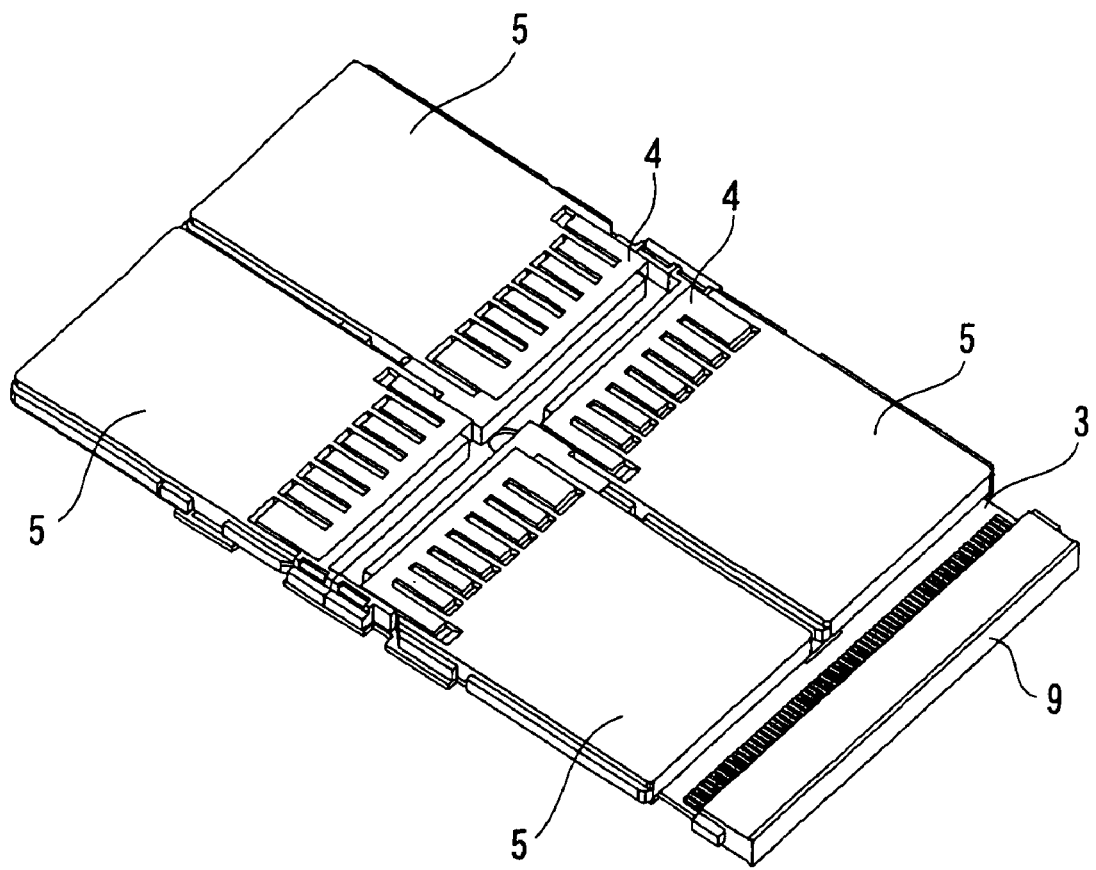

US 7,238,051 B2

PC CARD

TECHNICAL FIELD

The present invention relates to a PC card that is used for portable information processing equipment, for example, and more particularly to a configuration of a PC card that has a plurality of SD memory cards installed therein so as to be used as a large capacity memory card.

BACKGROUND ART

Recently PC card type adapters are used for installing memory cards, using such flash memories as SD memory cards, to a personal computer. In some cases a plurality of memory cards can be simultaneously installed in one adapter (e.g. see JP9-102019 A).

On the other hand, the capacities of memory cards are increasing, and more equipment records/reproduces large volumes of data, such as images, using these memory cards. And to meet the needs of large capacities, the use of not one memory card but a plurality of memory cards installed in a PC card, so as to be used as a large capacity memory card, has been proposed.

FIG. 13 shows an exploded perspective view of a conventional PC card where four SD memory cards are installed internally, and FIG. 14 shows a perspective view of the key sections of a PC card where four SD memory cards are mounted on a printed circuit board. This PC card is secured to the frame 1 with its cover 2 able to be snapped on, so that the PC card has a slim body. In the frame 1, the printed circuit board 3 is secured by bonding. In the printed circuit board 3, the housing of the connector 4 is positioned at the center and secured. Two SD memory cards 5 are disposed facing each other at both sides of the connector 4, that is a total of four are disposed on the printed circuit board 3. In other words, two SD memory cards 5 are disposed so that the respective long sides position adjacent to each other, and this pair of SD memory cards 5 are disposed with another pair of SD memory cards 5 facing each other, sandwiching the connectors 4.

FIG. 15 is a cross-sectional view of the connector 4, where the SD memory cards 5 are connected. In FIG. 15, the contact 8, which is a plate spring, is inserted to the slit formed on the connector 4, and is secured to the housing. These contacts 8 are formed in parallel so as to contact each terminal 5a of the SD memory card 5. Each contact 8 is connected to a control LSI, for example, which is not illustrated, on the rear face of the printed circuit board 3, via the circuit pattern, which is not illustrated, formed on the printed circuit board.

At assembly the connectors 4 are mounted first on the printed circuit board 3, then the SD memory cards 5 are inserted into the connectors 4 along the printed circuit board 3. Insertion completes when the tip of the SD memory card 5 contacts the housing of the connector 4, and in this state the terminal 5a contacts the contact 8. Although not illustrated, a positioning unit is formed on the housing of the connector 4 for controlling position by contacting the end face of the SD memory card 5, so that the SD memory card 5 does not move to the short side direction (direction perpendicular to the longitudinal direction of the PC card) when the SD memory card 5 is completely inserted into the connector 4. The card connector 9 is secured at one edge of the printed circuit board 3, and can be connected to an external device, such as a computer, via this connector 9.

The printed circuit board 3, on which four SD memory cards are inserted to the connectors 4 as shown in FIG. 14, is inserted into the frame 1 as shown in FIG. 13, and the printed circuit board 3 is secured to the frame 1. As FIG. 13 shows, the cushion material 20 is secured on the rear face of the cover 2, and the cover 2, engaged to the frame 1, presses the four SD memory cards 5 from the top so as to secure them to the printed circuit board 3.

However with this conventional configuration of a PC card and SD memory cards 5, the pressing force by the cushion material 20 tends to change depending on the dispersion of component accuracy, such as warping of the cover 2, and in some cases a sufficient pressing force cannot be acquired. As a result, the SD memory cards move inside the PC card, which causes a contact failure between the contact 8 of the connector 4 and the terminal 5a of the SD memory card 5.

Also when an external force is applied to the cover 2, the SD memory card 5 is pressed via the cushion material 20, and the printed circuit board 3 is warped, and as a result, the contact state of the terminal 5a of the SD memory card 5 and the contact 8 of the connector 4 changes, causing a contact failure. In some cases an external force applied to the cover 2 deforms the contact 8.

Also the SD memory cards 5 are simply covered by the frame 1 and the cover 2, and this configuration makes it difficult to protect them from the influence of static electricity from the outside.

DISCLOSURE OF THE INVENTION

With the foregoing in view, it is an object of the present invention to provide a highly reliable PC card where contact of the terminal sections of the SD memory card and the contacts of the connectors are more stable, with four SD memory cards being installed internally. It is another object of the present invention to provide a PC card of which the internally installed SD memory cards are hardly affected by static electricity from the outside.

To achieve these objects, the present invention provides a PC card comprising: a frame of which an opening area is covered by a cover; a printed circuit board secured inside the frame; connectors, of which a housing section is secured substantially at the center of the printed circuit board, and which comprises contacts that are disposed in parallel extending in both longitudinal directions of the PC card; a total of four SD memory cards of which the terminal sections can contact the connectors, and which are disposed two each on the printed circuit board; and pressing members which hold the respective two SD memory cards disposed at the same side with respect to the connectors, and press and secure the SD memory cards to the printed circuit board and the housing section of the connectors.

According to the present invention, the connectors and the four SD memory cards can be secured compactly on the printed circuit board with maintaining positional accuracy by pressing and securing the SD memory cards on the printed circuit board by the pressing members, and a contact failure between the terminal sections and the contacts hardly occurs, therefore the four SD memory cards can be housed in the PC card with securing reliability. Also the SD memory cards can be secured after mounting the connectors on the printed circuit board, so assembly is easy, and also the SD memory cards can be removed if the pressing members are removed from the printed circuit board, so superb PC cards having easy maintenance can be provided.

In the present invention, the pressing member is made of a conductive member, and the engagement means of the pressing member is secured in a state contacting the ground of the printed circuit board.

BRIEF DESCRIPTION OF THE DRAWINGS

FIG. 6 is a diagram depicting the positional relationship of the SD memory cards according to the first embodiment of the present invention;

FIG. 10 is an exploded perspective view depicting the major areas of the constituent elements of the PC card according to the second embodiment of the present invention;

FIG. 14 is a perspective view depicting the major areas of the configuration of a conventional printed circuit board.

BEST MODE FOR CARRYING OUT THE INVENTION

Figure 1:
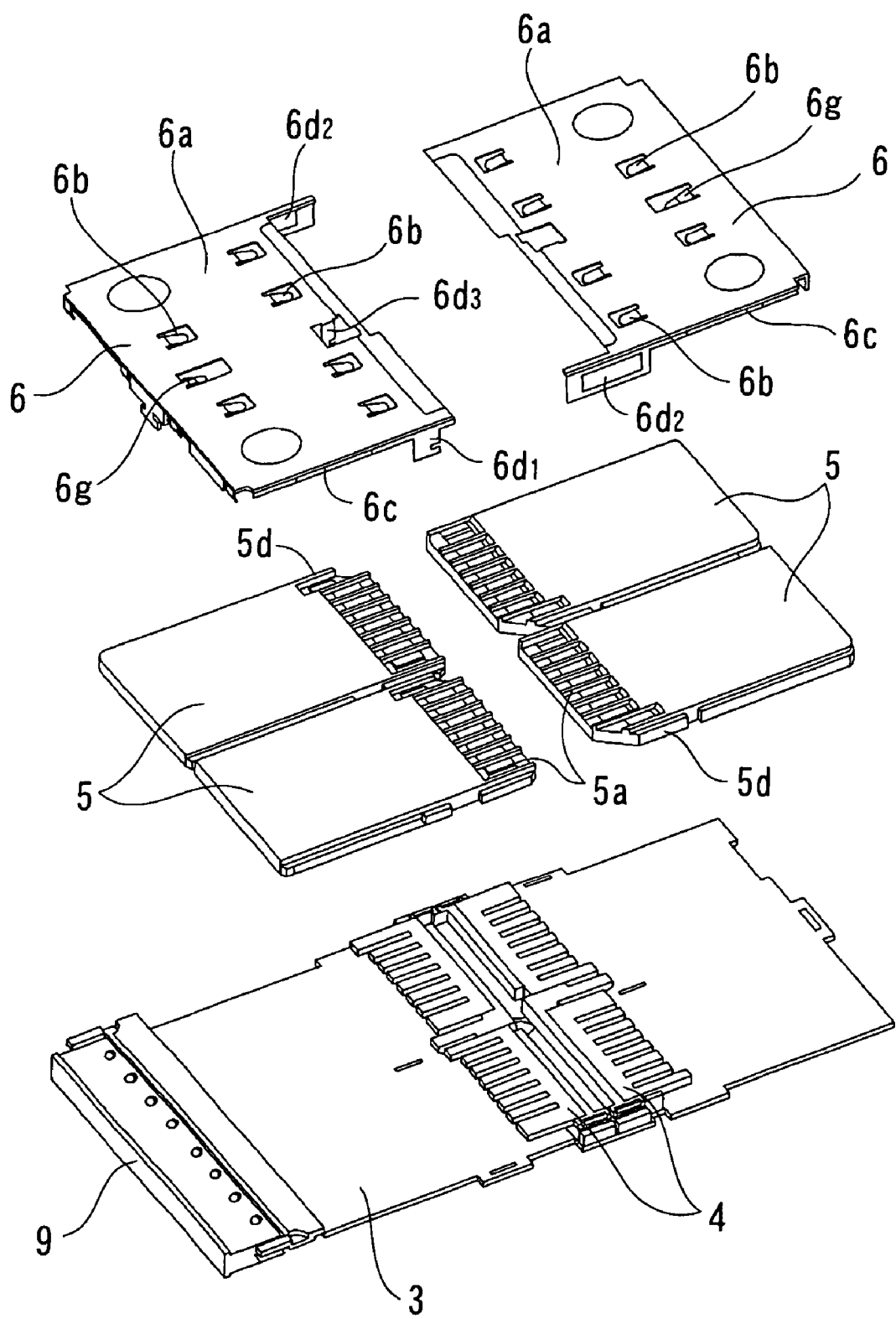
FIG. 1 is an exploded perspective view of the major areas of the constituent elements of the PC card according to the first embodiment of the present invention.

According to the first aspect of the present invention, a PC card comprises: a frame of which an opening area is covered by a cover; a printed circuit board secured inside the frame; connectors, of which a housing section is secured substantially at the center of the printed circuit board, and which comprises contacts that are disposed in parallel extending in both longitudinal directions of the PC card; a total of four SD memory cards of which the terminal sections can contact the connectors, and two each are disposed on both sides of the connectors on the printed circuit board; and pressing members which hold the respective two SD memory cards disposed at the same side with the connectors as the boundaries, and press and secure the SD memory cards to the printed circuit board and the housing section of the connectors. By this configuration, the respective two SD memory cards are held by the pressing members and are pressed to the printed circuit board and the housing of the connectors, so the connectors and the SD memory cards can be secured on the printed circuit board with maintaining positional accuracy, which makes it difficult to be affected by the dispersion of component accuracy and to be shifted in position even if external impact is applied.

The second aspect of the present invention is characterized in that the pressing members comprise a main body covering the top of the SD memory cards disposed two each on both sides of the connectors, a side plate formed by bending the main body, and pressing pieces made of an elastic body integrated into the main body and the side plate. By integrating the elastic pressing pieces into the main body and the side plate, the SD memory cards can be pressed to the printed circuit board and the connector housing, therefore a compact and inexpensive pressing plate can be provided by a simple configuration.

The third aspect of the present invention is characterized in that the pressing members further comprise engagement means extending downward for securing the pressing members to the printed circuit board on at least one of the main body and the side plate. By this configuration, the engagement means can secure the SD memory cards on the printed circuit board with certainty.

The fourth aspect of the present invention is characterized in that at least one engagement piece of the engagement means passes through the gap created by at least one of the notches of the memory cards and the notch sections of write protection switches when two of the SD memory cards are lined up. By allowing the engagement piece to pass through the gap of the notch sections of the SD memory cards, the pressing plate can be secured compactly in a narrowly configured space.

The fifth aspect of the present invention is characterized in that a first engagement piece, formed at one end of the edge of the pressing member at the connector side, out of the engagement means, passes through the gap of the notch sections outside the write protection switches of the two SD memory cards disposed on the same side with the connectors as the boundaries, and is secured in a hole of the printed circuit board, and a second engagement piece, formed at the other end of the edge of the pressing member at the connector side, engages the protrusions at the terminal side adjacent to the outside notches of the two SD memory cards respectively, and the distance between the first engagement piece and the second engagement piece is shorter than the width of the two SD memory cards. By this configuration, where the distance between the first engagement piece and the second engagement piece is shorter than the width of the two SD memory cards, the engagement pieces can be created without making steps at the peripheral area of the pressing members, in addition to the effect of the fourth aspect of the invention.

The sixth aspect of the present invention is characterized in that a third engagement piece created at the center of the edge of the pressing member at the connector side, out of the engagement means, passes through the gap created by the inside notch sections of the write protection switches of the two SD memory cards respectively and the inside notches of the SD memory cards, and is secured in a hole of the printed circuit board.

The seventh aspect of the present invention is characterized in that a fourth engagement piece created at the center of the edge of the pressing member on the opposite side from the connector side, out of the engagement means, passes through the gap created by the round corner areas of the two SD memory cards respectively, and is secured in a hole of the printed circuit board.

The eighth aspect of the present invention is characterized in that the holes, through which the first, third and fourth engagement pieces penetrate, are formed on the printed circuit board, notch sections are created at the tips of the first, third and fourth engagement pieces, and after penetrating the first, third and fourth engagement pieces through the holes of the printed circuit board, the tips of the first, third and fourth engagement pieces are bent on a plane parallel with the printed circuit board or in the printed circuit board direction from the notch sections, so as to secure the pressing members to the printed circuit board.

As described above, by penetrating the engagement pieces through the holes of the printed circuit board and securing them, positioning to the printed circuit board with high accuracy is implemented, and the pressing members rarely deviate in position. Also by bending the tips of the engagement pieces on a plane parallel with the printed circuit board or in the printed circuit board direction from the notch sections, the pressing members can be easily secured to the printed circuit board within the limited space. In particular, by bending the tips of the engagement pieces on a plane parallel with the printed circuit board, the heights of the pressing members become substantially the same when installed, which makes the pressing force of the SD memory cards constant, and can maintain a stable state.

The ninth aspect of the present invention is characterized in that the pressing pieces are disposed near the first to fourth engagement pieces. By disposing the pressing pieces in this way, the reactive force of pressing the SD memory cards acts on the area near the fixed points of the engagement pieces, which can decrease the deformation of the printed circuit board and can stably apply pressing force to the SD memory cards.

The tenth aspect of the present invention is characterized in that notch sections, that can engage with the first engagement piece and the second engagement piece respectively with almost no gap, and a long hole through which the third engagement piece penetrates, are created on the printed circuit board, and after a notch section is created at the tip of the third engagement piece and the third engagement piece penetrate through the long hole of the printed circuit board, the pressing member is moved in the connector direction so that the tips of the first and second engagement pieces are engaged with the above notch sections of the printed circuit board so as to be secured.

By the above configuration, the SD memory cards can be secured at a predetermined position by sliding the pressing members to the connector side without bending the tips of the engagement pieces. Therefore the above configuration, with which the SD cards can be secured to the printed circuit board without bending the engagement pieces, allows securing the SD memory cards to the printed circuit board simply and accurately.

The eleventh aspect of the present invention is characterized in that a plate member is disposed on a rear side of the printed circuit board so as to contact the printed circuit board, and holes, through which the third and fourth engagement pieces penetrate, are created on the printed circuit board and the plate member, notch sections are created at the tips of the third and fourth engagement pieces, and after penetrating the third and fourth engagement pieces through the holes of the printed circuit board and the holes of the plate member, the tips of the engagement pieces are bent from the notch sections on a plane parallel with the plate member or in the direction of the plate member, so that the pressing members are secured to the plate member.

By the above configuration, the SD memory cards and the printed circuit board can be held and secured by the pressing members and the plate member, and since bending stress is hardly generated on the printed circuit board, stress is not applied to the electric components and the patterns on the printed circuit board.

The twelfth aspect of the present invention is characterized in that the pressing member is made of a conductive member, and is secured in a state where the engagement means of the pressing member is contacting the ground of the printed circuit board.

By the above configuration, where the SD memory cards are covered with conductive members, static electricity has little effect on the SD memory cards.

The thirteenth aspect of the present invention is characterized in that the plate member is made of a conductive member, and is secured in a state where the plate member is contacting the ground of the printed circuit board.

By the above configuration, where the SD memory cards are covered with conductive members, static electricity has little effect on the SD memory cards.

The fourteenth aspect of the present invention is characterized in that the pressing pieces for pressing the SD memory cards to the printed circuit board side are disposed at positions corresponding to the corners of the SD memory cards. And by this configuration, an IC inside an SD memory card can be protected from external force.

Now an embodiment of the present invention will be described with reference to the drawings.

EMBODIMENT 1

(Background Description)

Figure 2:
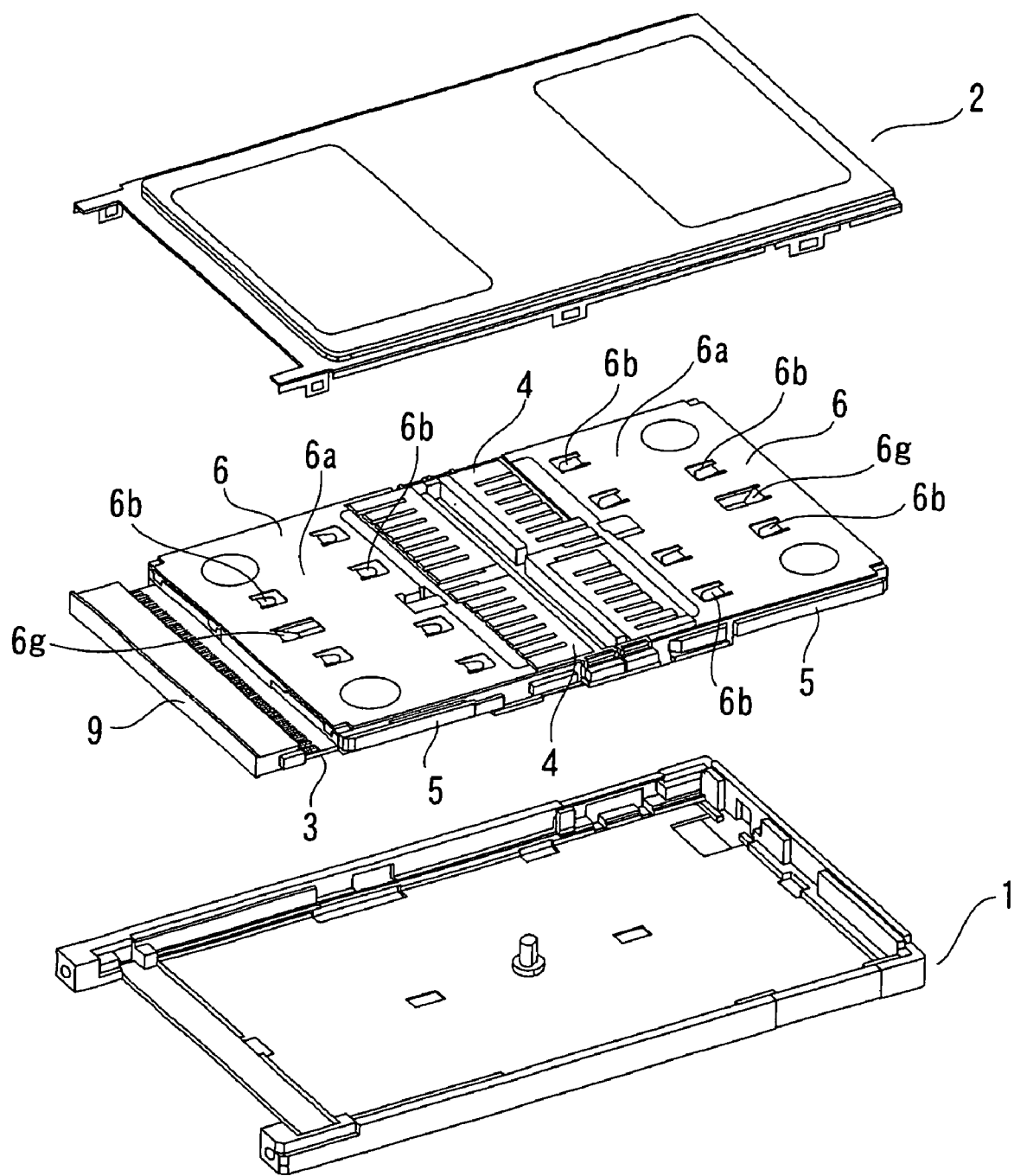
FIG. 2 is an exploded perspective view depicting the constituent elements of the PC card according to the first embodiment of the present invention.
Figure 3:
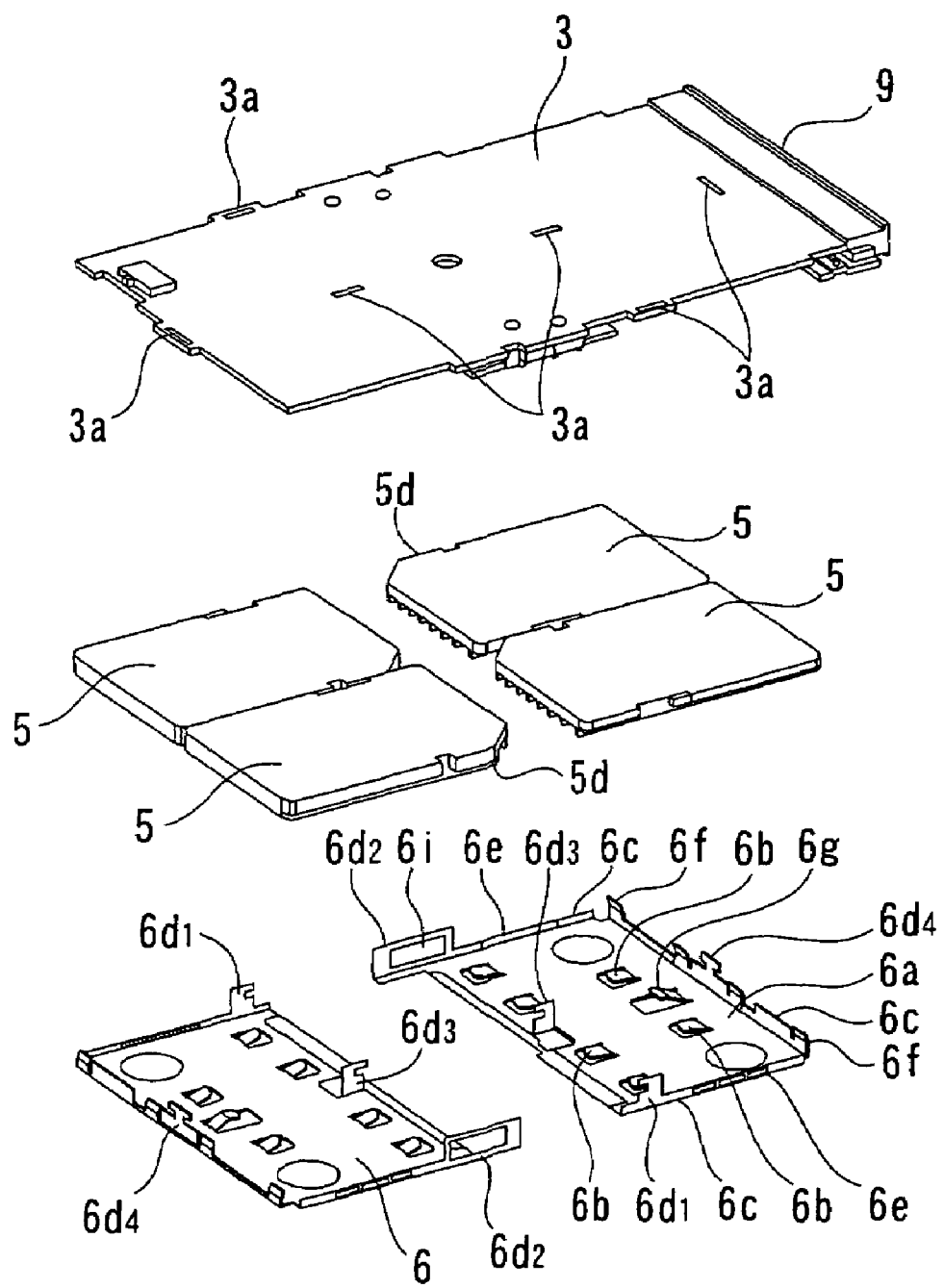
FIG. 3 is an exploded perspective view depicting the major areas of the PC card according to the first embodiment of the present invention viewed from the rear side.

FIG. 1 is an exploded perspective view depicting the major areas of the constituent elements of the PC card according to the present invention, FIG. 2 is an exploded perspective view depicting the constituent elements of the PC card, and FIG. 3 is an exploded perspective view depicting the major areas of the PC card according to the present invention viewed from the rear side. The same constituent elements as those of the prior art are denoted with the same reference numerals, for which detailed description is omitted.

In FIG. 1-FIG. 3, the difference from the prior art is that the pressing members 6 are disposed. The pressing members 6 are made of a metal elastic body, and are disposed over the two SD memory cards 5 inserted into the connectors 4 respectively, so as to cover these two SD memory cards 5.

The present invention faced the problem where a simple configuration of covering the pressing members 6 on the SD memory cards 5 of the PC card was not sufficient. In other words, the SD memory cards and the PC cards have strict dimensional specifications based on standards thereof, so there is no extra space for disposing the pressing members 6. Therefore marked innovation is required to dispose the pressing members 6 in the PC card. This issue will be described first.

Figure 4:
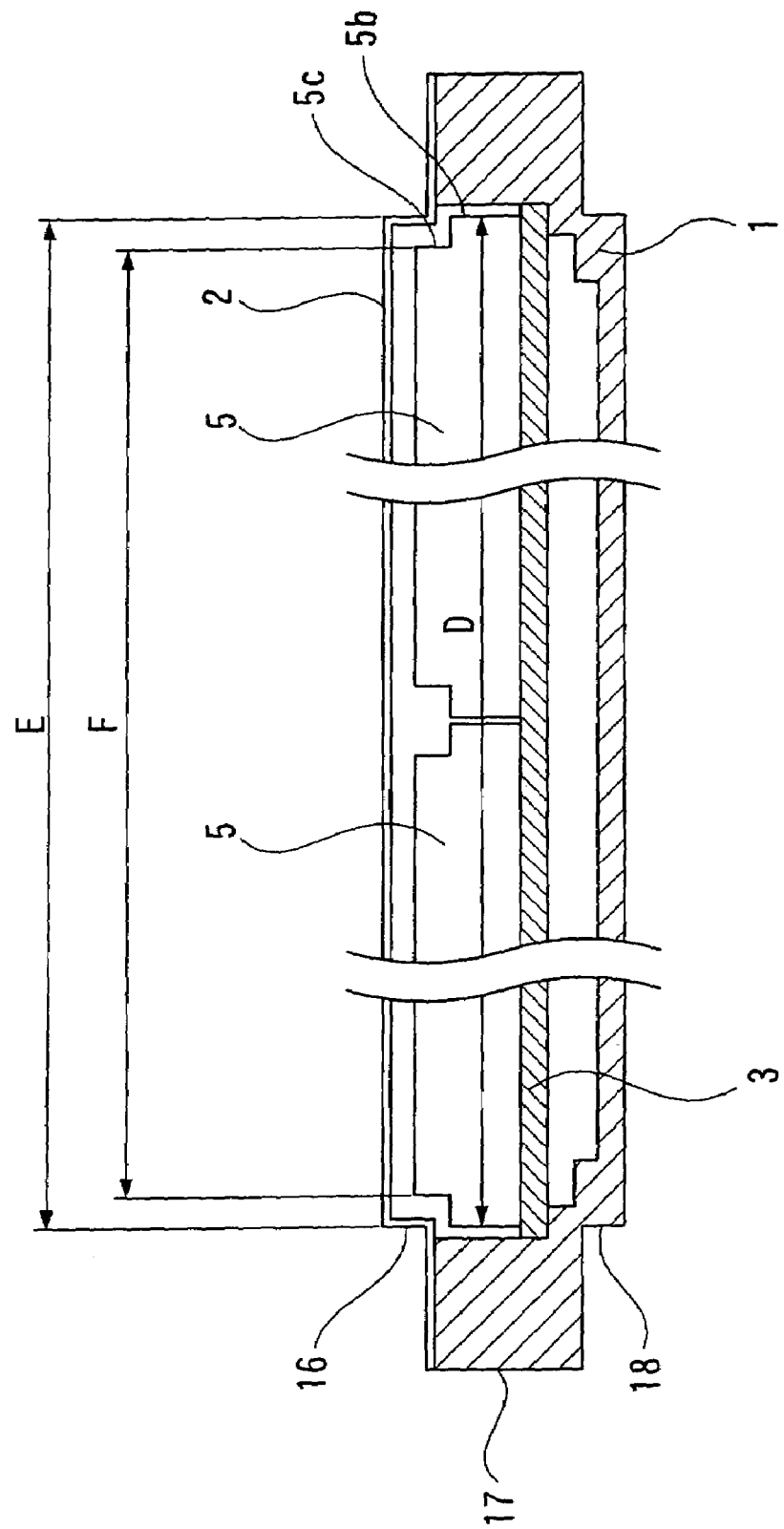
FIG. 4 is a cross-sectional view depicting the PC card and the SD memory cards.

FIG. 4 is a cross-sectional view depicting the SD memory cards housed in the PC card, the frame and the cover according to the present invention. The dimensions of the external shape of the PC card is specified by a PC card standard, and if four SD memory cards 5 are inserted into the PC card according to the present invention, the area occupied by the SD memory cards is large, and it is difficult to secure sufficient space for disposing the first to fourth engagement pieces $6d_1$-$6d_4$ that are the engagement means for securing the pressing members 6 to the printed circuit board 3.

The shape of the SD memory card 5 is specified by the SD Memory Card Standard. The SD memory card 5 is comprised of two levels, the upper level 5b and the lower level 5c, with the upper level 5b as the front side. In FIG. 4, however, the SD memory cards are disposed upside down on the printed circuit board 3, so that the lower level Sc positions on top. As FIG. 4 shows, the upper level is wider than the lower level. In other words, the upper level 5b is 1.4 mm thick and 24 mm wide, and the lower level 5c is 0.7 mm thick and 22.5 mm wide, and the lower level has steps on both ends.

There are three types of PC cards according to the PC card standard, depending on the thickness at the center area, that is types I, II and III, classified by escalating thickness, and in this invention, the type II, which is normally used, is used for the description. The same configuration is also possible with type III, which is thicker than type II. The shape of type II is comprised of three levels, the upper level 16, mid-level 17 and lower level 18, and the upper level and the lower level have a thickness of 0.85 mm, and a maximum width E of 48 mm, and the mid-level area is 3.3 mm thick and 54 mm wide.

When two SD memory cards 5 are lined up next to each other, the width between both ends of the upper level of the two SD memory cards is 48 mm, but since the accuracy dispersion of the components must be considered, some gap must be created between the two SD memory cards 5. For example, the gap is 0.15 mm in this embodiment, so the width D between both ends of the two SD memory cards 5 at the upper level 5b is 48.15 mm. Therefore the upper level 5b of the two SD memory cards cannot be disposed within the width E (48.00 mm) of the upper level 16 and the lower level 18 of the PC card, but the two SD memory cards can be disposed in the mid-level 17, since the mid-level 17 is somewhat wider than the top level 16.

Also in this case, the width F between both end faces of the lower level 5c of the two SD memory cards 5 is 46.65 mm. If width F is subtracted from width E and divided by 2, the result is 0.675 mm. If the plate thickness of the PC card is 0.2 mm, the gap between the inner wall of the PC card and the lower level 5c of the SD memory card is 0.475 mm. In this case, if the thickness of the pressing members 6 is 0.2 mm, then the pressing members 6 fit in the width E of the upper level of the PC card with a 0.275 mm gap remaining, since a 0.475 mm gap has been secured on one side, as mentioned above.

In order to secure the pressing members 6 to the printed circuit board 3 in a stable state in this positional relationship, the engagement pieces $6d_1$-$6d_4$, which are engagement means, must be secured to the printed circuit board 3 at positions outside both end faces of the two SD memory cards.

Figure 5:
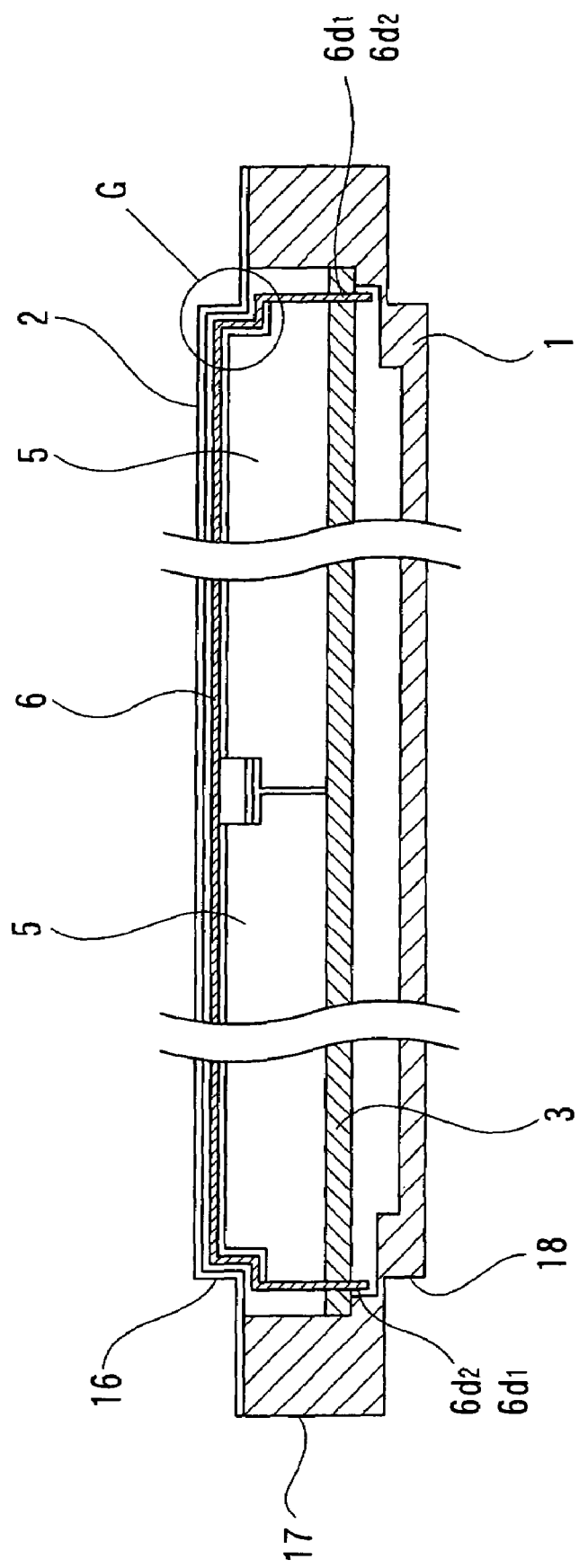
FIG. 5 is a cross-sectional view depicting the PC card and the SD memory cards where the pressing members are temporarily disposed.

FIG. 5 is a cross-sectional view of the pressing members, assuming the case when the first and second engagement pieces $6d_1$-$6d_2$ are extending along the step shape of the SD memory card, as shown in the area G. However as FIG. 5 shows, the pressing members 6 cannot be processed easily at high precision as the number of bending sections of the first and second engagement pieces $6d_1$ and $6d_2$ increase. This processing increases the manufacturing cost.

If accuracy cannot be maintained and the gap between the pressing members 6 and the top panel of the PC card is small, then the sections of the first and second engagement pieces $6d_1$ and $6d_2$ of the processing members 6, which are bent in the step shape, contact the bent section of the top panel of the PC card, which make assembly impossible. Therefore the gap between the pressing members 6 and the top plate of the PC card must be secured by moving the printed circuit board 3, the SD memory cards 5 and the pressing members 6 downward in the PC card. As a result, the gap between the bottom face of the printed circuit board 3 and the bottom face of the PC card decreases, and the height of the electric components to be mounted on the bottom face of the printed circuit board 3 is limited for this amount, and the components to be mounted are restricted. Therefore the configuration of the pressing members shown in FIG. 5 is inappropriate to implement the invention.

With the foregoing in view, the present inventor paid attention to the fact that the pressing members 6 can be secured in a small space by disposing the first, second and third engagement pieces $6d_1$-$6d_3$ in the space generated by the notches created on the body of the SD memory cards 5, when the two SD memory cards 5 are lined up, and the notch sections of the write protection switches, as described below.

FIG. 6 is a diagram depicting the positional relationship when the two SD memory cards are lined up. FIG. 6 shows that the gap 13 is generated by the notch section 10 of the write protection switch and the notch 11 when the two SD memory cards 5 are lined up such that the long sides thereof are adjacent to each other. The first and third engagement pieces $6d_1$ and $6d_3$ of the pressing member 6 are lowered into this gap 13 created between the two SD memory cards and the gap 10 of the SD memory card 5 at the right, and the second engagement piece $6d_2$ of the pressing member 6 is engaged with the protrusion at the terminal side adjacent to the notch 11 of the SD memory card 5 at the left, then the pressing member 6 can be secured in a narrowly configured space.

Figure 7:
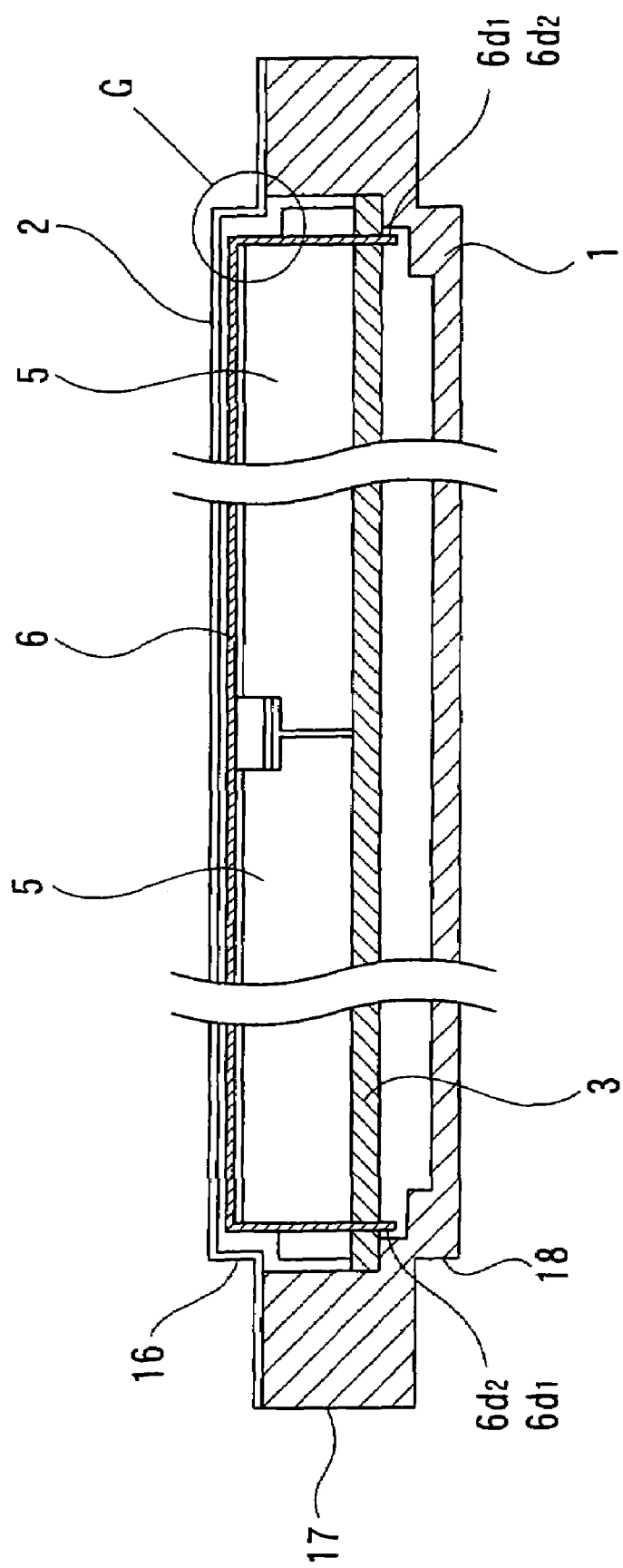
FIG. 7 is a cross-sectional view depicting the PC card and the SD memory cards where the pressing members according to the first embodiment of the present invention are disposed.

Therefore as FIG. 7 shows, the first and third engagement pieces $6d_1$ and $6d_3$ are disposed in the gap of the notches 11 of the two SD memory cards 5 and the notch sections 10 of the write protection switches, and the second engagement piece $6d_2$ of the pressing member 6 is engaged with the protrusion at the terminal side adjacent to the notch 11, then the first and third engagement pieces $6d_1$ and $6d_3$ can be disposed along the peripheral face of the lower level 5c, and the shapes of the engagement pieces $6d_1$ and $6d_3$ become simple and accuracy can be guaranteed. It is unnecessary to lower the position on the printed circuit board, and the height of the components to be mounted on the rear face of the printed circuit board 3 can be higher for that amount. In this case, the width of the pressing member 6 can be narrower than the width of the upper level of the two SD memory cards 5.

The write protection switch of the SD memory card does not switch between write enable state and write disable state by detecting the state inside the SD memory card 5, but switches the state by the detection means installed outside the SD memory card 5, and in the present invention, this write protection switch is not used, so lowering the first engagement piece $6d_1$ of the pressing member 6 into the gap of the notch section 10 of the write protection switch has no effect on the write operation.

(Description of Configuration)

A detailed configuration of the pressing member 6 will be described with the above issues in mind.

In FIG. 1-FIG. 3, 6a indicates the main body of the pressing member 6. This main body 6a has a rectangular shape, and the dimensions in the longitudinal direction is substantially the same as the width of the SD memory cards 5 disposed next to each other in parallel, and the dimensions in the shorter direction are dimensions that allow the terminals 5a of the SD memory cards 5 to be exposed. In the following description, the edge in the longitudinal direction is called the "end edge", and the shorter edge is called the "lateral edge".

The plate springs 6b (pressing pieces), which are elastic bodies, are created on the main body 6a. The plate springs 6b contact the top face of the SD memory card 5, and press the SD memory card 5 to the printed circuit board 3. The plate springs 6b are created by cutting and lifting a part of the main body 6a, and three plate springs are disposed respectively for one SD memory card 5. In other words, three plate springs 6b, disposed in an inverted L-shape, are disposed symmetrically with respect to the center line connecting the center of the lateral edges of the main body 6a.

The pressing member 6 has a side plate 6c created by the three peripheral edges of the main body 6a by being bent at right angles. The side plate 6c is created at three edges, excluding the edge where the terminals 5a of the SD memory card 5 positions, and is created to match the shape of peripheral edge of the SD memory card 5.

The L-shaped first engagement piece $6d_1$ protrudes at the tip of one lateral edge of the side plate 6c. Also at the center of the end edge of the main body 6a at the terminal side, the L-shaped third engagement piece $6d_3$ is created by cutting and lifting. The first and third engagement pieces $6d_1$ and $6d_3$ are bent at right angles in the terminal 5a direction, and extend in a direction to the printed circuit board 3. These first and third engagement pieces $6d_1$ and $6d_3$ are created at positions corresponding to the notch 11 created on the body of the SD memory cards and the notch section 10 of the write protection switch, as mentioned above.

The T-shaped fourth engagement piece $6d_4$ protrudes at the center of the end edge of the side plate 6c at the opposite side of the terminals 5a. The fourth engagement piece $6d_4$ is created at a position corresponding to the gap created by the rounded corners of the two SD memory cards 5 respectively.

By securing the first, third and fourth engagement pieces 6d to the holes 3a created on the printed circuit board, the pressing members 6 are secured to the printed circuit board 3, and the SD memory cards 5 are pressed and secured to the printed circuit board 3.

The second engagement piece $6d_2$ is created at the tip of the other lateral edge of the side plate 6c. At the center of a rectangular piece of this second engagement piece $6d_2$, a hole 6i is created, and the pressing member 6 is engaged with the SD memory cards 5 and the printed circuit board 3 by the hole 6i engaged with the protrusion 5d at the terminal 5a side adjacent to the notch 11 of the SD memory card 5. A part of the second engagement piece $6d_2$ is engaged to the notch 11.

The plate springs 6e on both sides, which constitute a part of the side plate 6c, and the plate springs 6f (pressing piece) of the end edge side, are elastic bodies and are bent slightly inward to press the SD memory card 5 inward.

At the center of the longitudinal direction of the main body 6a, closer toward the end edge side, the contact 6g, for contacting with the end face of the step area of the SD memory card, is created by cutting and lifting.

Figure 8:
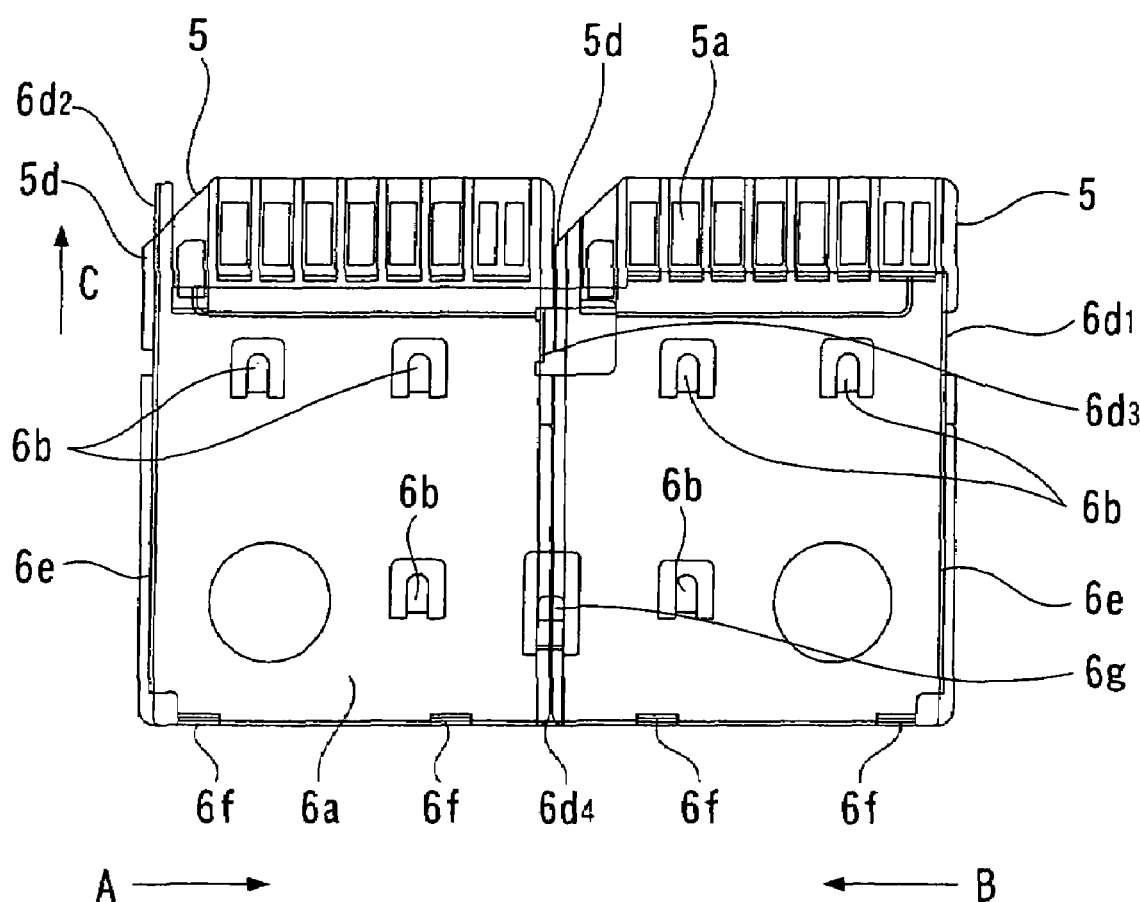
FIG. 8 is a diagram depicting the positional relationship of the pressing members and the SD memory cards according to the first embodiment of the present invention.

FIG. 8 is a plan view depicting the state where the pressing member 6 is engaged to the two adjacent SD memory cards. In FIG. 8, the two SD memory cards 5 are housed in the main body 6a.

The contact 6g of the pressing member 6 is between the two SD memory cards 5 and both edges of the contact 6g contacting the end face of the step area of the respective SD memory cards 5.

The side face (longitudinal side) of each SD memory card 5 is pressed inward by the plate springs 6e on both sides of the pressing member 6 respectively. In other words, in FIG. 8, the SD memory card 5 at the left is pressed in the arrow "A" direction, and the SD memory card 5 at the right is pressed in the arrow "B" direction, so that the two SD memory cards 5 are pressed in a direction of pressing each other. As a result, the end face at the step area of each SD memory card 5 contacts to both edges of the contact 6g, and the SD memory card 5 is held by the plate spring 6e and the edge of the contact 6g. In other words, two SD memory cards 5 hold the contact 6g from both sides.

The pressing members 6 press the two SD memory cards 5 to the printed circuit board 3 using the plate springs 6b at three locations respectively. A total of six plate springs 6b of the pressing member 6 are created around the first engagement piece $6d_1$, second engagement piece $6d_2$, third engagement piece $6d_3$ and fourth engagement piece $6d_4$ for securing the SD memory cards 5 to the printed circuit board 3. By disposing the plate springs 6b in this way, the reactive force pressing the SD memory cards 5 is applied to the area around the fixed points of the first to fourth engagement pieces $6d_1$-$6d_4$, which can decrease the deformation of the printed circuit board 3 and allows pressing the SD memory cards 5 in the printed circuit board 3 direction stably.

As described in the prior art, the terminal side of the SD memory card 5 is structured such that the positioning unit, which is not illustrated, created on the connector 4, prevents shifting of the SD memory card 5 to the short edge direction (direction perpendicular to the longitudinal direction of the PC card).

And a part of the positioning unit is created between the two SD memory cards 5 near the terminals in a shape similar to the contact 6g, so as to hold the two SD memory cards 5 with appropriate balance along with the contact 6g.

Figure 15:
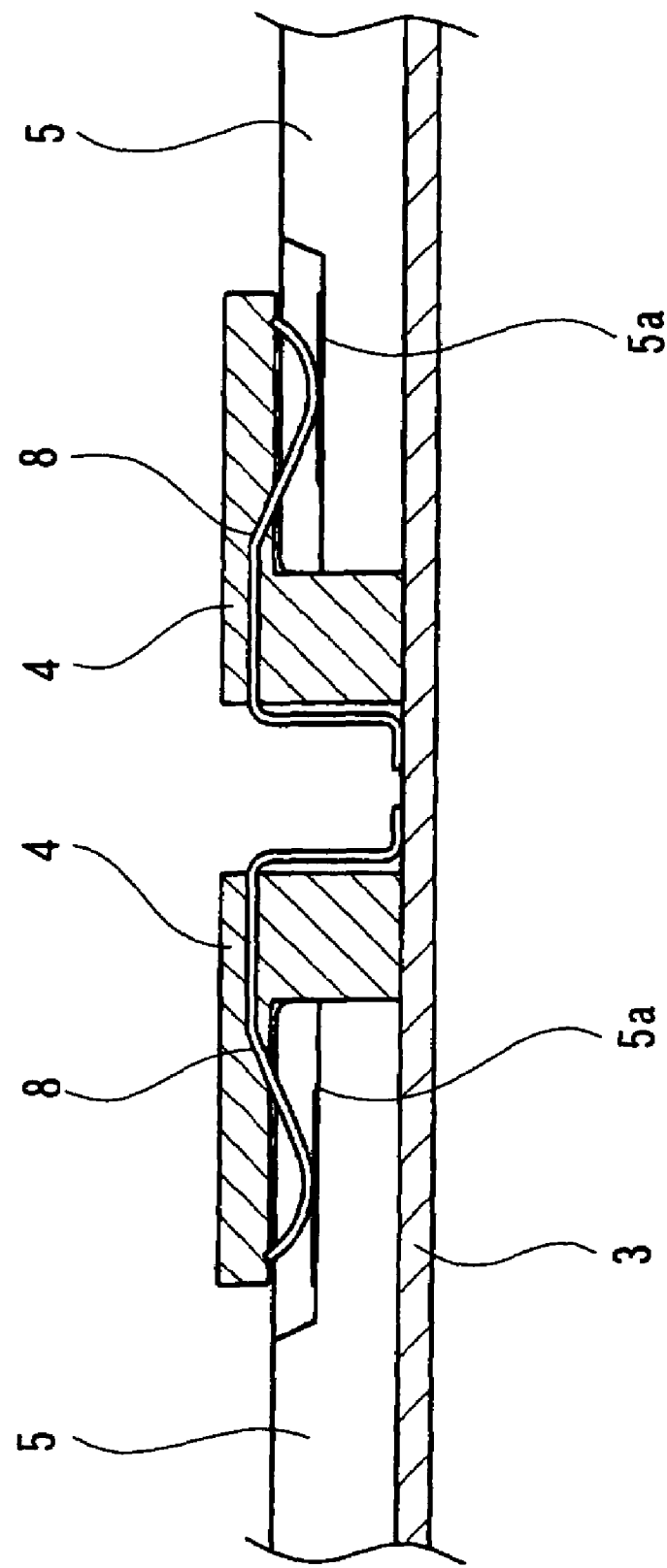
FIG. 15 is a cross-sectional view depicting conventional connector sections.

On the other hand, the plate springs 6f at the end edge side press the two SD memory cards 5 on the opposite side of the terminals, that is the rear face side, and apply pressure in the arrow "C" direction in FIG. 8. The end faces of the SD memory cards 5 at the terminal side contact the housing sections of the connectors 4, as shown in FIG. 15, and the SD memory cards 5 are pressed against the housing sections of the connectors 4.

(Assembly Method)

Now the assembly method of the PC card will be described.

During the assembly of the above configuration, the four SD memory cards 5 are slid in the lateral direction so that the terminals 5a contact the contacts 8 of the connectors 4 in a state where the connectors 4 are mounted and fixed on the printed circuit board 3 in advance. Then the pressing members 6 are disposed over the SD memory cards 5 so as to cover the SD memory cards 5. At first, the second engagement piece $6d_2$ is engaged to the SD memory card 5 and the printed circuit board 3, and the first, third and fourth engagement pieces $6d_1$, $6d_3$ and $6d_4$ are penetrated into the holes 3a of the printed circuit board 3.

When the pressing member 6 is secured to the printed circuit board 3, the plate springs 6b contact the top face of the SD memory cards 5 so the pressing member 6 receives force in a direction away from the printed circuit board 3.

Therefore in the state where the pressing member 6 is being pressed in the printed circuit board 3 direction, the tips of the first, third and fourth engagement pieces $6d_1$, $6d_3$ and $6d_4$ are bent. By this, the bent tips of the first, third and fourth engagement pieces contact the rear face of the printed circuit board 3, and the plate springs 6b press the SD memory cards 5 in a direction to the printed circuit board 3, so the pressing member 6 receives force in a direction to the printed circuit board 3, and as a result, the SD memory cards can be secured by pressing against the printed circuit board 3. And by bending the tips of the first, third and fourth engagement pieces on a horizontal plane from the notch section, the heights of the bent sections contacting the printed circuit board 3 become substantially constant, and as a result, the SD memory cards 5 can be pressed against the printed circuit board 3 with a constant force, with little dispersion of the heights of the pressing member 6 from the printed circuit board 3.

Figure 9:
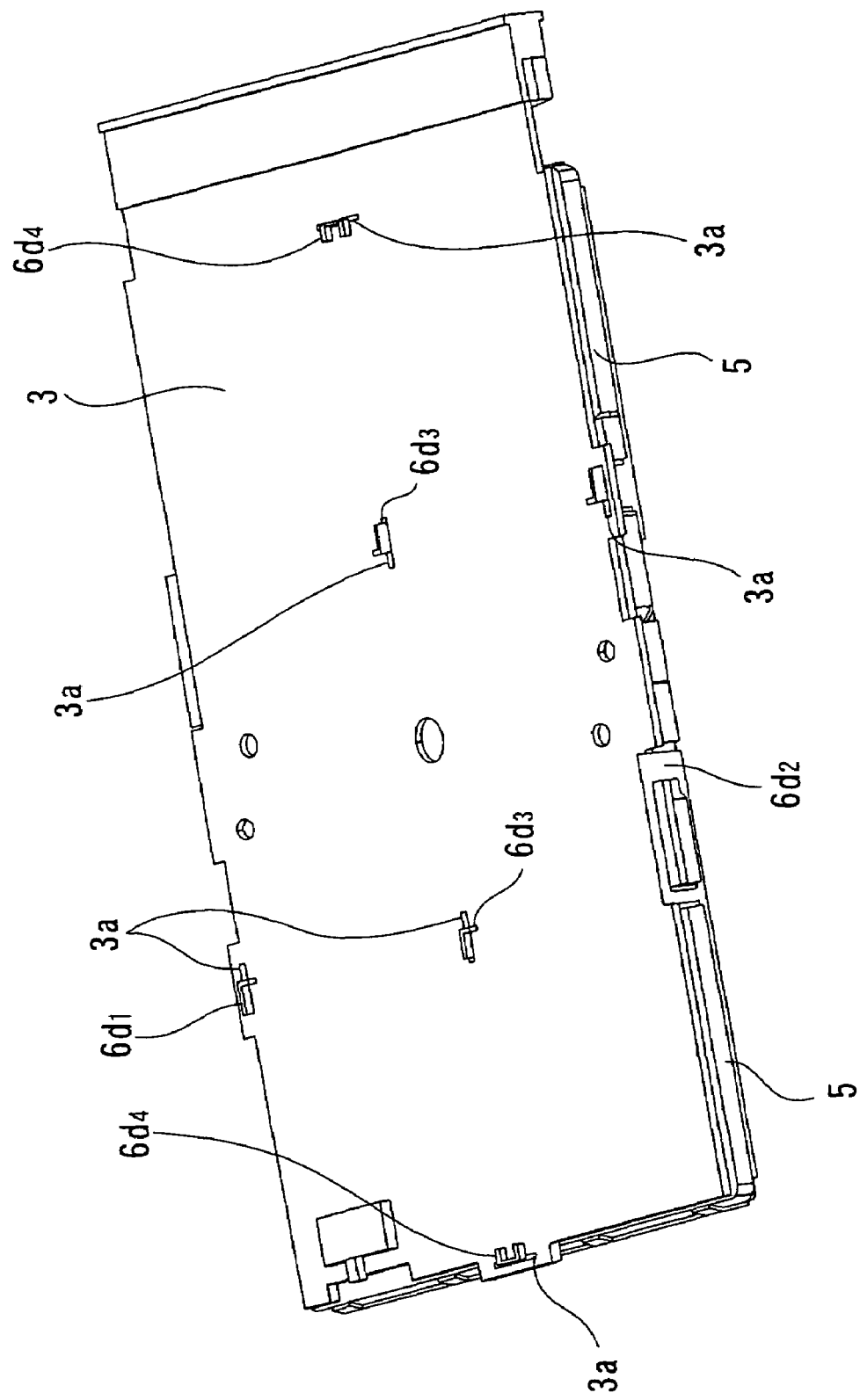
FIG. 9 is a perspective view depicting the rear face side of the printed circuit board.

FIG. 9 is a perspective view depicting the state where the engagement pieces of the pressing member 6 are secured to the printed circuit board 3. In FIG. 9, the holes 3a are accurately created corresponding to the positions of the connectors with respect to the printed circuit board 3. The first, third and fourth engagement pieces $6d_1$, $6d_3$ and $6d_4$ of the pressing member 6 are penetrated through the holes 3a, then these engagement pieces are bent on a horizontal plane from the notch section created on the engagement pieces $6d_1$, $6d_3$ and $6d_4$ for securing. By penetrating through the holes 3a, the pressing member 6 can be positioned at high precision with respect to the printed circuit board 3, and this also makes it difficult for the pressing members 6 to deviate position from the printed circuit board 3.

If the change in height, when the pressing member 6 is ignored, can be ignored, then the tips of the engagement pieces $6d_1$, $6d_3$ and $6d_4$ may be bent in the printed circuit board 3 direction from the notch sections, and be secured.

The pressing member 6 is made of a conductive member, such as stainless and plated metal, and forms the ground area (not illustrated) around the holes 3a of the printed circuit board 3, so that the tips of the engagement pieces $6d_1$, $6d_3$ and $6d_4$ contact the ground area of the printed circuit board 3, and are secured. By this configuration, the SD memory cards 5 are covered with the conductive member, and receive little effect by static electricity from the outside. Also contact can be more secure by soldering the tips of the engagement pieces $6d_1$, $6d_3$ and $6d_4$ and the ground area.

(Functions)

By adhering to the above configuration, each two of the four SD memory cards are held by the pressing member 6, and are pressed and secured to the printed circuit board 3 and the housing of the connectors 4. Therefore the terminals 5a of the SD memory cards and the contacts of the connectors 4 can be secured on the printed circuit board 3 with assuring positional accuracy. Since the cover 2 and the SD memory cards 5 do not contact via a cushion material, warping of the cover 2 has no influence. And even if an external force is applied to the cover 2, the cover 2 does not directly press the SD memory cards 5, so the possibility of contact failure caused by a change of the contact state between the terminals 5a of the SD memory cards 5 and the contacts of the connectors 4 or a deformation of contacts can be minimized.

Also if a conductive member is used for the material of the pressing member, and is secured in the state of contacting the ground area of the printed circuit board 3, the influence of static electricity from the outside can be minimized.

(Variant Form)

In the present embodiment, the longitudinal edges of the two SD memory cards 5 are pressed inward by the plate springs 6e so as to be pressed against the contact 6g between the two SD memory cards 5, but instead of the contact 6g, a plate spring, to press the SD memory cards 5 outward, may be created, and the plate springs 6e are not used as springs but to function as walls, so that the two SD memory cards 5 are held between the walls and the plate spring.

Also it is possible to configure such that the contact 6g is not used, the longitudinal edges of the two SD memory cards contact each other, and the two SD memory cards press against each other by the plate springs 6e, however in the configuration of the present embodiment, the SD memory cards 5 press against each other via the contact 6g, and this is preferable even more since the SD memory cards 5 can be secured with certainty and secured with positional accuracy.

Securing of the SD memory cards 5 becomes even more certain by securing the pressing member 6 and the SD memory cards 5, or the SD memory cards 5 and the printed circuit board 3, or the pressing member 6, SD memory cards 5 and printed circuit board 3 by an adhesive.

The connectors 4 and the pressing member 6 may be integrated in advance which secures them. In this case however, the connectors 4 and the pressing member 6 must be secured to the printed circuit board 3 in a state where the SD memory cards 5 are inserted, so mounting of the connectors 4 is difficult, and an exchange of the SD memory cards 5 is difficult because the connectors 4 must be removed first. The present configuration, on the other hand, is preferable since a PC card which excels in both assembly and maintenance can be provided.

EMBODIMENT 2

FIG. 10 is an exploded perspective view using plate members according to the second embodiment. In FIG. 10, the difference from the first embodiment is that the plate members 12 are added.

The plate member is comprised of a square main body and string section. On the plate member 12, holes 12a are created substantially at the same positions as holes 3a on the printed circuit board 3, and the third and fourth engagement pieces $6d_3$ and $6d_4$ of the pressing member penetrate through the holes 3a of the printed circuit board 3 and the holes 12a of the plate member 12, then the engagement pieces are bent on a horizontal plane or in the direction of the plate member 12 at the notch sections, and are pressed and secured from the end face of the plate member 12.

In the present invention, the tips of the engagement pieces $6d_3$ and $6d_4$ of the pressing member 6 are bent and secured to the plate member 12, but it is also possible that long holes are created in the sliding direction on the plate member that can slide on the rear face of the printed circuit board 3, and the notches of the engagement pieces $6d_3$ and $6d_4$, which are created in this sliding direction, are passed through the long holes of the plate member, then engaged and secured by sliding the plating member.

By making the plate member 12 using a conductive member in this configuration, and by securing the engagement pieces of the pressing member 6 or the plate member 12 in the state of contacting the ground area of the printed circuit board 3 in this configuration, the influence of static electricity from the outside can be prevented.

By this configuration, the SD memory cards 5 and the printed circuit board 3 are held and pressed to each other between the pressing member 6 and the plate member 12, and bending stress is hardly exerted on the printed circuit board 3, so deformation of the printed circuit board 3, after installing the pressing members 6, hardly occurs. As a result, stress is hardly generated on the pattern and the components mounted on the printed circuit board 3, and higher reliability can be secured.

EMBODIMENT 3

Figure 11:
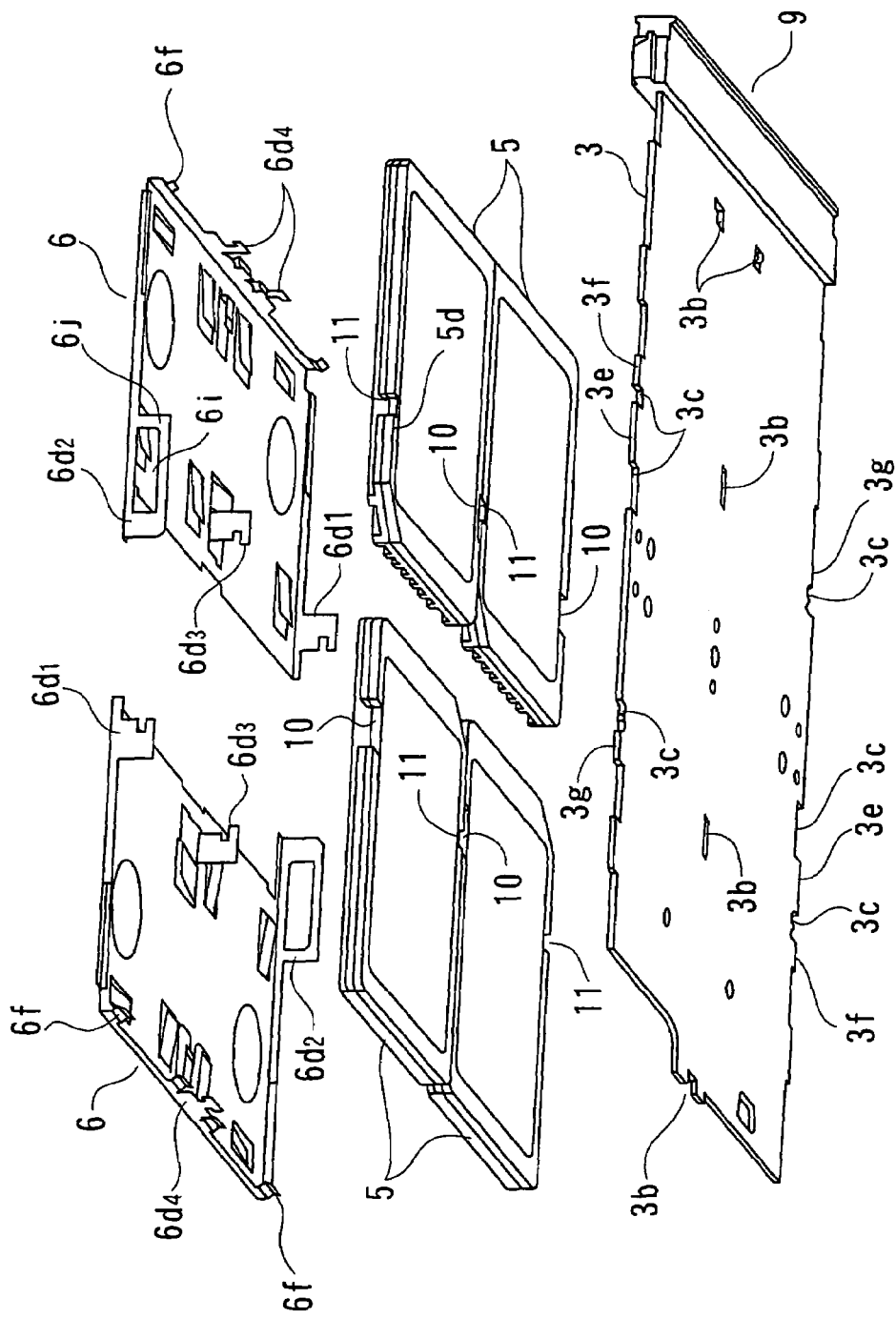
FIG. 11 is an exploded perspective view depicting the major areas of the constituent elements of the PC card according to the third embodiment of the present invention.

FIG. 11 is an exploded perspective view of another embodiment of a method of securing the pressing member to the printed circuit board. As mentioned above, the pressing member 6 holds the SD memory cards 5 and secures them to the printed circuit board 3. According to the present embodiment, the width of the hole 6i of the second engagement piece 6$d_2$ is created so that the protrusion 5d of the SD memory card can engage to the hole with almost no gap, and the width of the protrusion 3e of the printed circuit board 3, on the other hand, is created to be narrower than the hole 6i. At the tips of the third engagement piece 6$d_3$ and the fourth engagement piece 6$d_4$, notch sections, having a groove width which is slightly larger than the thickness of the printed circuit board 3, are created. Long holes 3b that can engage to the third engagement piece 6$d_3$ and the fourth engagement piece 6$d_4$ are created on the printed circuit 3.

During assembly, the SD memory cards 5 are set in advance with maintaining some gap from a predetermined position of the connectors. And the second engagement piece 6$d_2$ is hooked to the protrusions 5d adjacent to the notch 11 of the SD memory cards and the protrusion 3e adjacent to the notch sections 3c of the printed circuit board 3 at the same time. In this case, the third engagement piece 6$d_3$ and the fourth engagement pieces 6$d_4$ are inserted into the long holes 3b created on the printed circuit board 3, and the pressing member 6 is disposed on the printed circuit board 3, so that a part 6j of the second engagement piece 6$d_2$ positions outside the protrusion 3f of the printed circuit board 3, and the first engagement piece 6$d_1$ positions outside the protrusion 3g of the printed circuit board 3. At this time, the first engagement piece 6$d_1$ and the second engagement piece 6$d_2$ open slightly outward within the elastic deformation range by the protrusions 3f and 3g. And the pressing member 6 is shifted to the connector 4 side. Deformation is eliminated and the first engagement piece 6$d_1$ moves into the notch section 3c when the first engagement piece 6$d_1$ is released from the protrusion 3g and positioned at the notch section 3c. In the second engagement piece 6$d_2$, the width of the hole 6i is wider than the width of the protrusion 3e of the printed circuit board 3, so the SD memory cards 5 in engaged state can slide on the printed circuit board 3 to the connector 4 side. The deformation of the second engagement piece 6$d_2$ is eliminated and the second engagement piece 6$d_2$ moves to the notch section 3c, when the second engagement piece 6$d_2$ is released from the protrusion 3f and is positioned at the notch section 3c. The groove width of the notch section created at the tips of the third and fourth engagement pieces 6$d_3$ and 6$d_4$ is created to be slightly wider than the thickness of the thickness of the printed circuit board 3, and the grooves of the notch sections engage to the printed circuit board 3, and move to the connector side. Movement stops when the first engagement piece 6$d_1$ and the second engagement piece 6$d_2$ are engaged to the notch sections 3c, and secured at predetermined positions.

The width of the notch section, which engages to the first engagement piece 6$d_1$, is created to be substantially the same width as the first engagement piece, and the width of the notch section 3c, which engages to the second engagement piece 6$d_2$, is also created to be substantially the same as the width of the second engagement piece 6$d_2$, so the second engagement piece 6$d_2$ and the first engagement piece 6$d_1$ engage to the notch sections of the printed circuit board 3 without gaps, therefore the pressing member 6 cannot move to the opposite side from the connectors, and is secured at a predetermined position. In other words, the two SD memory cards 5 are pressed against the housing sections of the connectors 4 by the plate springs 6f of the pressing member 6. A reactive force is applied to the pressing member 6 in a direction away from the connector 4, but the second engagement piece 6$d_2$ and the first engagement piece 6$d_1$ are engaged at the notch sections 3c of the printed circuit board 3 and cannot be moved, therefore the pressing member 6 can secure the SD memory cards 5 to the printed circuit board 3 in the state of pressing the SD memory cards 5 to the housing sections of the connectors 4.

Figure 12:
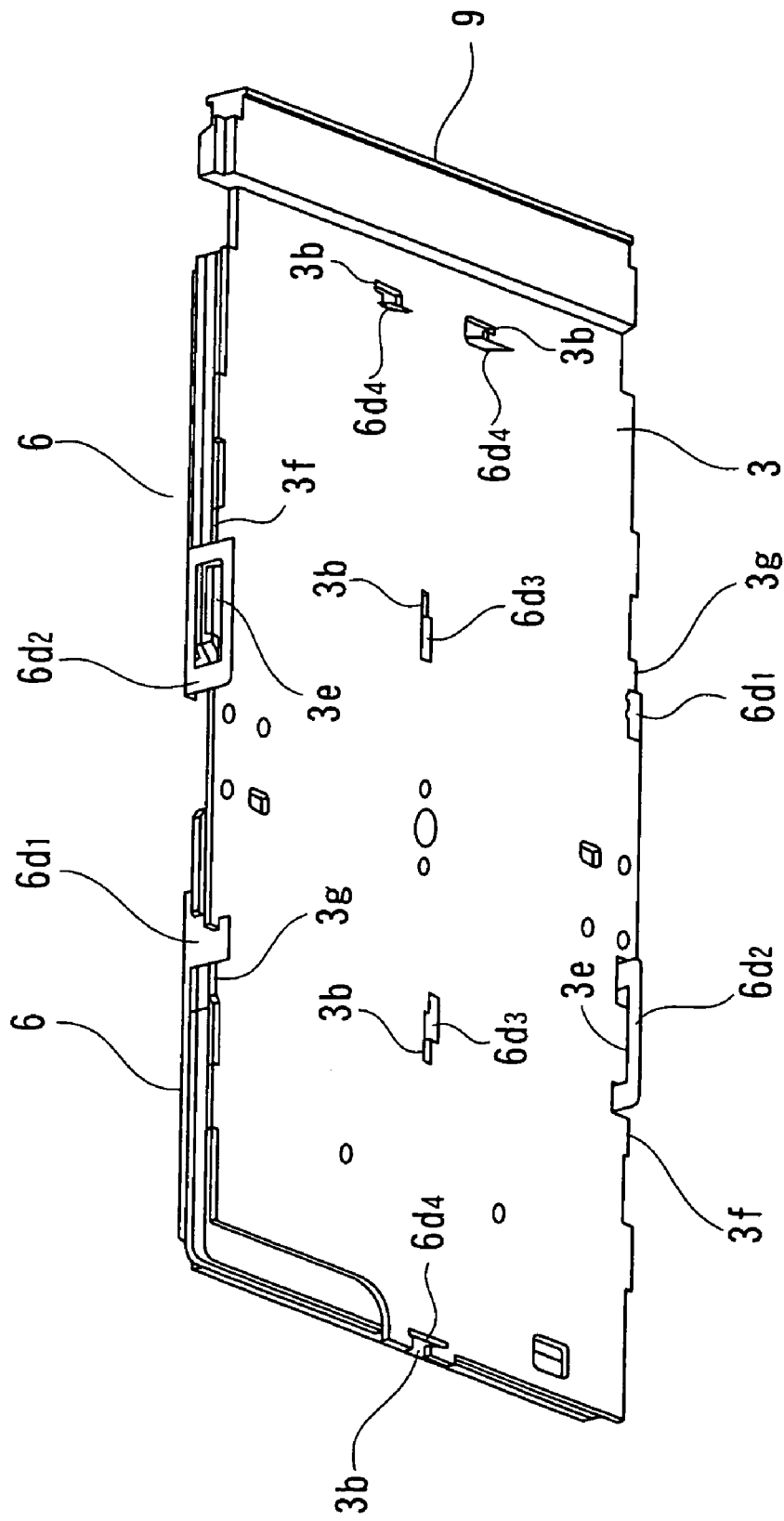
FIG. 12 is a perspective view depicting the rear face side when the constituent elements in FIG. 11 are assembled.
Figure 13:
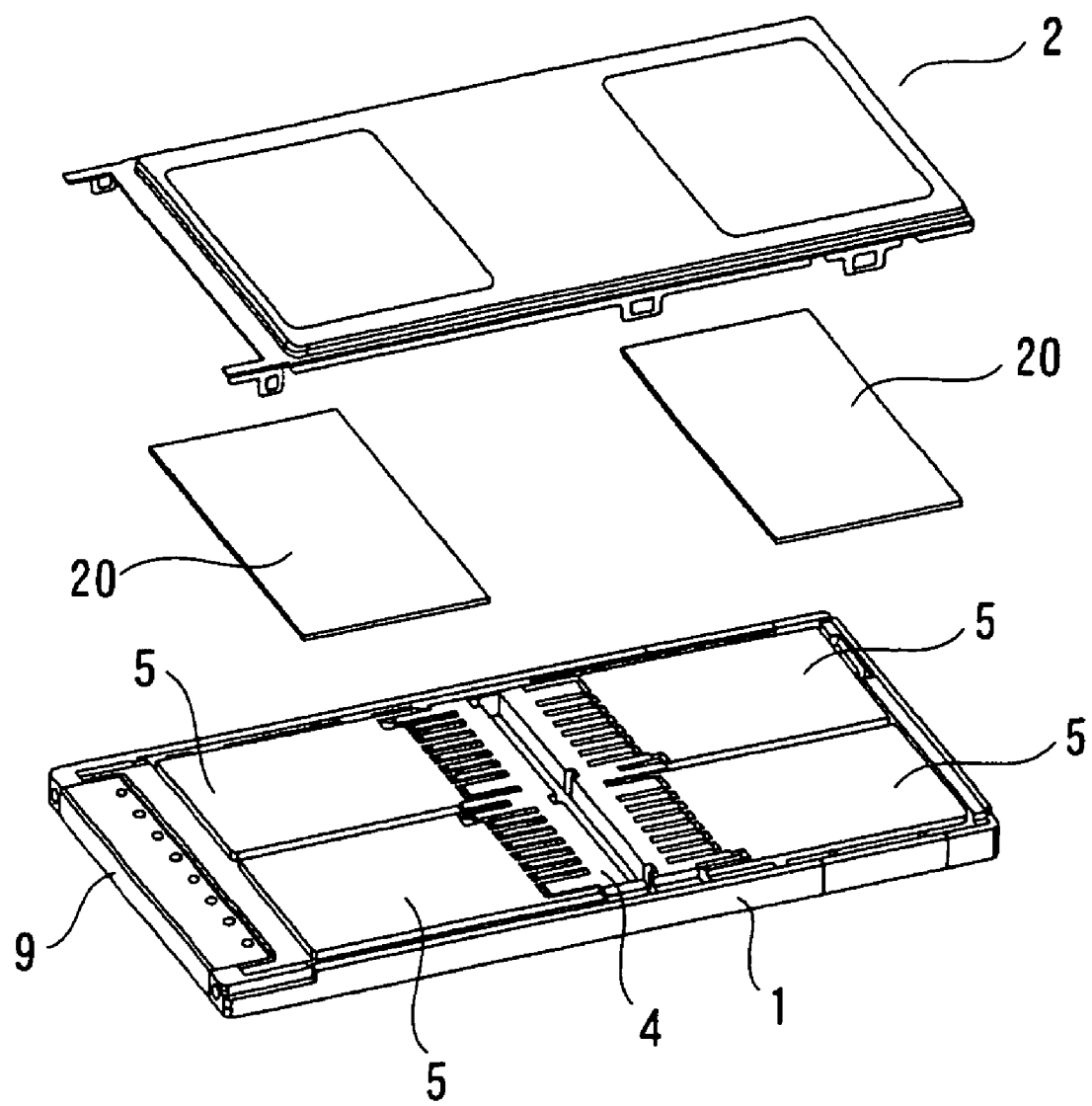
FIG. 13 is an exploded perspective view depicting a conventional PC card.

FIG. 12 is a perspective view depicting the state where the pressing members are secured to the printed circuit board.

According to the above embodiment, the SD memory cards can be secured at predetermined positions merely by sliding the pressing member to the connector side without bending the tips of the engagement pieces, therefore the SD memory cards can be secured to the printed circuit board without involving an operation to bend the engagement pieces, and the SD memory cards can be secured simply and with good accuracy.

In the above first to third embodiments, three engagement pieces of the engagement means are created on the main body 6a of the pressing member 5 in an inverted L-shape respectively, so a total of six engagement pieces are created symmetrically, but the engagement pieces may be created at eight locations corresponding to the four corners of an SD memory cards. In any case, it is preferable that the engagement pieces press the peripheral area of the SD memory cards 5 so as to protect the ICs enclosed in the SD memory cards.

INDUSTRIAL APPLICABILITY

The present invention provides a highly reliably PC card which encloses four SD memory cards internally, and stabilizes the contacts between the terminals of the SD memory cards and the contacts of the connectors.

The invention claimed is:

1. A PC card, comprising:
   a frame having an opening area covered by a cover;
   a printed circuit board secured inside the frame;
   connectors having a housing section secured substantially at the center of the printed circuit board, and comprising contacts disposed in parallel to extend in both longitudinal directions of the PC card;
   a total of four SD memory cards having terminal sections capable of contacting said connectors, the respective two of the four SD memory cards being disposed on both sides of said connectors on said printed circuit board; and
   pressing members holding the respective two SD memory cards disposed at the same side with said connectors as the boundary from both longitudinal side faces thereof, pressing said SD memory cards to the upper surface of said printed circuit board, and pressing and securing said SD memory cards in the direction from the rear face of said SD memory cards to the housing section of said connectors.

2. The PC card according to claim 1, wherein said pressing member comprises a main body covering the top of said respective two SD memory cards disposed two each on both sides of the connectors, a side plate formed by bending said main body, and pressing pieces made of an elastic body integrated into said main body and said side plate.

3. The PC card according to claim 1, wherein said pressing member is made of a conductive member, and is secured in a state where the engagement means of said pressing member is contacting a ground of said printed circuit board.

4. The PC card according to claim 1, wherein the pressing pieces for pressing the SD memory cards towards the printed circuit board are disposed at positions corresponding to corners of the SD memory cards.

5. The PC card according to claim 2, wherein said pressing members further comprises engagement means extending downward for securing said pressing members to said printed circuit board on at least one of said main body and said side plate.

6. The PC card according to claim 5, wherein at least one engagement piece of said engagement means passes through a gap created by at least one of notches of the memory cards and notch sections of write protection switches when two of said SD memory cards are lined up.

7. The PC card according to claim 5, wherein a first engagement piece formed at one end of the edge of said pressing member at the connector side passes through a gap of notch sections outside write protection switches of said two SD memory cards disposed on the same side respectively with said connectors as the boundaries, and is secured in a hole of the printed circuit board, and a second engagement piece formed at the other end of the edge of said pressing member at the connector side engages a protrusion at the terminal side adjacent to the outside notches of said two SD memory cards respectively, and a distance between said first engagement piece and the second engagement piece is smaller than a width of the two SD memory cards.

8. The PC card according to claim 5, wherein a third engagement piece created at the center of the edge of said pressing member at the connector side out of said engagement means passes through the gap created by inside notch sections of write protection switches of said two SD memory cards respectively and inside notches of the SD memory cards, and is secured in a hole of the printed circuit board.

9. The PC card according to claim 5, wherein a fourth engagement piece created at the center of the edge of the pressing member opposite from the connector side out of said engagement means passes through a gap created by corner round areas of the two SD memory cards respectively, and is secured in a hole of the printed circuit board.

10. The PC card according to claim 7, wherein the holes through which said first, third and fourth engagement pieces penetrate are formed on said printed circuit board, notches are created at tips of said first, third and fourth engagement pieces, and after penetrating said first, third and fourth engagement pieces through the holes of said printed circuit board, the tips of said first, third and fourth engagement pieces are bent on a plane parallel with the printed circuit board or in a direction of the printed circuit board from the notch sections, so as to secure said pressing members to said printed circuit board.

11. The PC card according to claim 7, wherein the pressing pieces are disposed near said first to fourth engagement pieces.

12. The PC card according to claim 7, wherein notch sections that can engage to said first engagement piece and second engagement piece respectively with almost no gap, and a long hole through which said third engagement piece penetrates, are created on said printed circuit board, a notch section is created at the tip of said third engagement piece, and after said third engagement piece is penetrated through the long hole of said printed circuit board, the pressing member is moved in a direction of the connector so that the tips of said first and second engagement pieces are engaged to said notch sections of the printed circuit board so as to be secured.

13. The PC card according to claim 8, further comprising a plate member disposed on a rear side of said printed circuit board so as to contact said printed circuit board, wherein holes through which said third and fourth engagement pieces penetrate are created on said printed circuit board and said plate member, notch sections are created at the tips of said third and fourth engagement pieces, and after penetrating said third and fourth engagement pieces through the holes of said printed circuit board and the holes of said plate member, the tips of said engagement pieces are bent from the notch sections on a plane in parallel with said plate member or in a direction of said plate members, so that said pressing member is secured to said plate member.

14. The PC card according to claim 13, wherein said plate member is made of a conductive member and is secured in a state where said plate member is contacting a ground of said printed circuit board.

* * * * *